United States Patent [19]
Robinson et al.

[11] Patent Number: 4,651,282
[45] Date of Patent: Mar. 17, 1987

[54] MICROCOMPUTER BASED KEYBOARD COMMAND ENTRY CONCEPT FOR VHF COMMUNICATION AND NAVIGATION SYSTEMS

[75] Inventors: Eugene A. Robinson, Dallas; Claude A. Sharpe, Plano; James W. Iseli, Lewisville; Julio E. Valella, Carrollton; Kuen-Yu Liu, The-Colony, all of Tex.

[73] Assignee: Texas Instruments Incorporated, Dallas, Tex.

[21] Appl. No.: 615,509

[22] Filed: May 30, 1984

[51] Int. Cl.$^4$ ............... G06F 15/50; H04B 1/26; H04B 1/38; H04B 7/00

[52] U.S. Cl. ............... 364/443; 364/449; 455/77; 455/186

[58] Field of Search ............... 364/443, 446, 449, 450, 364/451, 452; 455/76, 77, 183, 186

[56] References Cited

U.S. PATENT DOCUMENTS

| | | | |
|---|---|---|---|
| 3,936,828 | 2/1976 | Muesse et al. | 364/452 X |
| 4,212,067 | 7/1980 | Henderson | 364/448 X |
| 4,253,150 | 2/1981 | Scovill | 364/449 |
| 4,267,597 | 5/1981 | Volpi et al. | 455/76 |
| 4,270,213 | 5/1981 | Falk et al. | 455/77 |
| 4,317,226 | 2/1982 | Belisomi | 455/183 X |
| 4,371,978 | 2/1983 | Lusko | 455/77 |
| 4,454,583 | 6/1984 | Schneiderhan et al. | 364/449 |
| 4,491,966 | 1/1985 | Morcerf et al. | 455/77 X |

*Primary Examiner*—Felix D. Gruber
*Attorney, Agent, or Firm*—Richard K. Robinson; N. Rhys Merrett; Melvin Sharp

[57] ABSTRACT

Airborne navigation and communication systems are disclosed including a VOR/LOC (VHR Omnirange/-Localizer) receiver and a communication transceiver each with separate control and display panels. Each panel includes a ten push-button press keys numbered 0-9, a function controller for operating mode selection and general control, a pair of digital displays (5 digits each) for displaying keyboard channel selection including an active channel and a standby channel and additional data, three function press keys—one for switching a standby channel into the active channel or vice versa or resetting the timer or changing the digital bearing display from "TO" to "FROM", a second key for either recalling a channel or backing up to a digit for correction during data entry, and a third key for storing frequency in memory locations or entering data. The panels are connected to a data processor and the data processor is connected to a plurality of circuits corresponding to the panel functions whereby the panel commands are received by the data processor and the data processor stores the panel's information in electronically alterable ROMs, or controls the operation of the plurality of circuits or both in response to the panel commands and generates return signals for display and output to other instruments.

16 Claims, 14 Drawing Figures

Fig. 4a

MICROCOMPUTER BASED KEYBOARD COMMAND ENTRY CONCEPT FOR VHF COMMUNICATION AND NAVIGATION SYSTEMS

BACKGROUND OF THE INVENTION

This invention relates to airborne avionic systems and more particularly to an airborne system including either a (VOR/LOC) VHF omnirange/localizer or a communication transceiver or both.

In the past airborne avionic systems have included a communication transceiver stacked with a VOR/LOC receiver for operator convenience. The communication transceiver and VOR/LOC receiver includes panels having a pair of displays and knob controlled frequency selectors for selecting an active and a standby channel. A megahertz knob is coaxially alligned with a kilohertz knob for channel selection. To facilitate knob selection the megahertz knob has a diameter significantly larger than the kilohertz knob and is mounted behind the kilohertz knob.

In addition, the VOR/LOC receiver includes a toggle switch which provided for switching one of the displays between the standby frequency and a TO bearing and a FROM bearing for a selected channel station. Further a slidable button type switch provided for switching the active and standby displays. When the switch is made between a standby channel frequency and a bearing, the channel frequency is stored in a nonvolatile RAM for switching back to the channel.

Several disadvantages attend the use of the prior art devices. For example, the manipulation of the channel tuning knobs are time consuming and channel changes are often required to be made by crew members when they are under heavy cockpit work loads, e.g. when preparing to land the aircraft. Further, the entry of only a standby and an active channel frequency limitation often necessitates the entry of additional channel frequencies during travel from a departure point to a destination point.

Accordingly it is an object of the present invention to provide an improved airborne avionic system which is easy to operate and maintain.

Another object is to provide an airborne avionic system including a low cost VOR/LOC receiver and a communication transceiver which have substantially similar front panels and substantially identical operational procedures.

A further object of the invention is to provide an airborne avionic system having multiple function capability which is selectable through a function controller for operating mode selection and which is easy to learn and simple to operate.

Still a further object of the invention is to provide an airborne avionic system including a programmable VOR/LOC receiver and/or communication transceiver permitting prior to take off the selection, entry and storage of channel frequencies necessary for take off, flight operations at way points and landing at a preselected destination point.

Briefly stated this invention comprises an airborne avionic system including a VOR/LOC (VHF omnirange/localizer) receiver and communication transceiver having panels including keyboards with numerically numbered press keys, multiple function selection switches, a pair of displays, function control press keys and indicators all of which are connected to a data processing means. The data processing means of the VOR/LOC receiver and communications transceiver, in response to their function selection and keyboard entry, stores a plurality of frequencies for active and standby channels which are selected for navigating and communicating in an aircraft from take off at a departure point through landing at a destination point. The processor means controls: frequency synthesizers for generating the selected (active) channel frequencies, the VOR/LOC receiver circuits and the communication transmitter receiver circuits, and the panels displays and indicators. The processing means is also utilized as a computing means in the navigation system, for example, in the clock mode and in the dead reckoning mode. In the clock mode timer functions are provided, under key press control, in the right side display. The timer function is useful in timing certain events during flight operations. In the dead reckoning mode the pilot can enter data describing aircraft speed over the ground and distance to destination and the navigation system computes and displays distance and time to destination and distance to destination and ground speed.

BRIEF DESCRIPTION OF THE FIGURES

The novel features characteristic of the embodiments of the invention may best be understood by reference to the following detailed description when read in conjunction with the accompanying drawings wherein;

FIGS. 4a–4e constitute a block diagram of the communications transceiver of this invention.

DETAILED DESCRIPTION OF THE EMBODIMENTS

VOR/LOC PANEL

Figure 1:
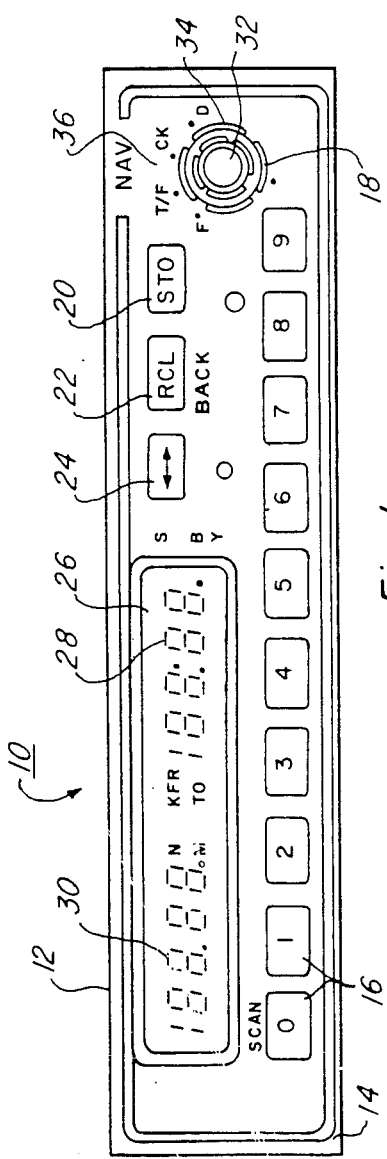
FIG. 1 is a plan view of the control and display panel for the VOR/LOC receiver.

Referring now to FIG. 1, the VOR/LOC panel 10 of a navigation (NAV) system comprises a housing 12 having a panel surface 14. The panel surface 14 has walls forming apertures for a plurality of press keys 16 numbered "0" through "9", respectively, a multiple function controller 18, a plurality of function control press keys 20, 22, and 24 and a display 26 including a pair of digital displays 28 and 30 with decimal indicators and data annunciators.

The function controller 18 includes ON/OFF-/Volume/IDENT/Mode control knobs 32 and 34. The control knob 32 has an OFF position indicator which is aligned with a panel supported OFF indicator when the system is OFF and rotated therefrom for turn ON and volume selection. Control knob 32 is stacked on the control knob 34 which has a diameter greater than that of knob 32 for ease of manipulation. The control knob 34 has a segmented periphery. The adjacent segments are spaced with one space bearing a function selection indicator for selection alignment with panel supported mode function indicators 36. The control mode function indicators 36 include a frequency indicator labeled "F", a To/From indicator "T/F", a clock indicator "CK" and a distance/time indicator "D". Control 32 is also a push/pull switch for selectively enabling and disabling the station identification information.

Function control press keys 20, 22, and 24, and the ten numerically numbered ("0"–"9") press keys 16 have dual function capability, and the pair of digital displays 28 and 30 are multiple purpose displays of five digits each and data annunciators. Each digit is a seven segment electronic digit and a decimal point indicator is positioned between the third and fourth digits.

Display (26) contains annunciators in its center area labeled "K" and "FR" or "TO" for annunciating, respectively, the speed in KNOTS on the left side display presentation and bearing FROM station or TO station on the right side display presentation (when the unit is in the F/T mode).

Control press keys 20, 22 and 24 are located in a row between the function selection switch 18 and the display 26 and adjacent to the top of the panel 14; while the ten numerically numbered press keys are located in a row beneath the display 26 and function control keys 20, 22 and 24. Function control keys 20, 22 and 24 are labeled respectively, "STO" (store), "RCL" (recall), and "←→" (digital display 28 or 30 selector); the panel 14 supports a label, adjacent function control key 22. The panel 14 also supports a "SCAN" label adjacent to the top of press key 16 labeled "0".

COMMUNICATION RECEIVER PANEL

Figure 2:
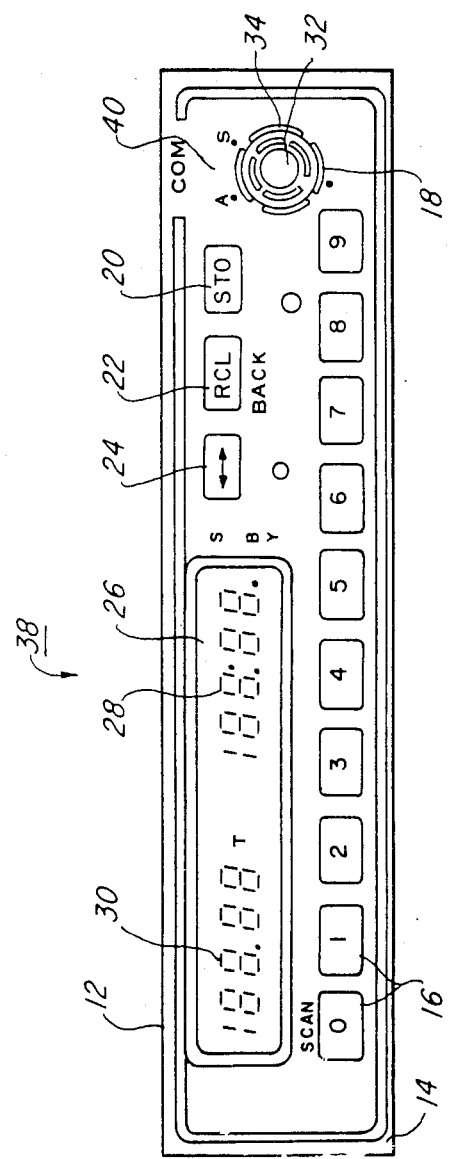
FIG. 2 is a plan view of the control and display panel for the communications transceiver.

The communication panel 38 (FIG. 2.) except for a function selection indicator 40 of the function controller 18 and the display labels is identical to the VOR/LOC panel 10. The function mode indicator 40 includes an active channel selection indicator labeled "A" and a standby channel selection indicator labeled "S". The left side of display 26 is labeled "T" for indicating transmitting selection.

OPERATION OF VOR/LOC PANEL

Referring now to Table 1 which is a function matrix for the airborne navigation system, the operation of the panel functions included are as follows. With the function controller 18 in the "F" (frequency) position a channel frequency is entered into the appropriate display blank by pressing the appropriate numerals as follows: the leading "1" is pressed and a one appears as the first digit with zero appearing in the remainder of the display blanks. The zeros for the digit blink successively to indicate the position for the next digit to be entered. If a mistake is made in a display blank, the "BACK" key is pressed to back to the display blank in error for entering the correct digit; thus alleviating the need to recycle the frequency. The frequency entering mode can be exited at any time by pressing the store "STO" key.

After entering the frequency, which appears in the standby display the transfer key "←→" is either pressed to sway the contents of the active and standby displays or the store "STO" key pressed followed by pressing one of the "0" to "9" keys for a selected memory location. This procedure is repeated for storing up to ten frequencies at ten memory locations. The channel frequency stored in locations 0–9 may be recalled into the standby display by pressing the recall "RCL" key and the number (0–9) of the desired frequency location.

If the "0" (SCAN) key is pressed (without a prior command) the memory location addressed by an internal pointer will be displayed for 0.5 seconds and the frequency stored at that location displayed in the standby display. The internal pointer will then be incremented by one. Repetitively pressing the "0" (SCAN) will recall the station frequencies stored in locations 0–9 in a consecutive manner (loop). The internal pointer is automatically set to location "0" at power up. Upon use of the channel storage or recall functions the pointer is set to the particular location used.

With the function controller in the To/From (T/F) position the active display shows the channel frequency and the standby display at power up displays the bearing from the station to the aircraft. The "FR" indicator preceding the bearing display is illuminated. To display the bearing to "TO" the station from the aircraft the transfer "←→" key is pressed. In this situation, the bearing is preceeded by the "TO" indicator which is illuminated.

In mode "T/F" frequency entry and memory operations can be conducted as described for mode "F" except that these functions operate directly on the active frequency. The bearing display is blanked and the receiver disabled during frequency entry. When a localizer channel has been selected as the active frequency, the bearing display remains blanked and the "TO"/"FROM" indicators are not illuminated.

With the controller in the clock "CLK" mode, the active display shows the active channel frequency. The standby display shows the elapsed time in minutes and seconds. The time is reset to zero by pressing the transfer "←→" key. This "stop watch" feature is useful in executing timed approaches and timed turns.

Frequency entry is the same as in the mode "F" position except that functions operate directly on the active frequency. The receiver is disabled during the frequency entry; the clock timer display is not disturbed.

Finally, in the dead reckoning computer "D" mode, the unit is used as a calculator to continuously display distance and time remaining to a desired way point. The distance to a way point and expected ground speed are entered, respectively, into the active and standby displays using the press keys 0–9. Thereafter, the unit calculates the distance and time remaining assuming a straight line course at the entered ground speed.

OPERATION OF COMMUNICATION TRANSCEIVER PANEL

The operation of the communication (COM) transceiver panel where possible is identical to that of the VOR/LOC receiver system. Thus the procedures are identical when the system is in the standby mode; when the system is in the "active" mode the frequency in the active display may be changed directly, during which time the standby display is blanked. Also the "0" numbered key is reserved for the emergency channel frequency (121.5 MHz) and the communication unit function controller does not have the clock position or the distance/time position. Further the push/pull knob 32 selectively enables or disables the audio squelch circuitry in the communication system.

EXAMPLES

Examples of the various operations of the NAV. and COM. units are set forth in the following tables 1, 2, 3, 4a, 4b, 5a, 5b, and 6a, 6b, 6c, 7, 8a, 8b, 9a and 9b.

TABLE 1
FUNCTION MATRIX

| FUNCTION SW POSITION | DISPLAY CONTENT LEFT | DISPLAY CONTENT RIGHT | MODE | KEY FUNCTION ⟷ | KEY FUNCTION STO | KEY FUNCTION RCL |
|---|---|---|---|---|---|---|
| 1 FREQUENCY | FREQ | FREQ | ENTRY | TOGGLE(freq) | ENTER(freq) | BACK |
|  |  |  | DISPLAY | TOGGLE(freq) | STORE(freq) | RECALL(freq) |
| 2 TO/FROM | FREQ | BANG/RADIAL | DISPLAY | TOGGLE(to/fr) | INOP | INOP |
| 3 CLOCK | FREQ | ELAPSED TIME | DISPLAY | RESET (clock) | INOP | INOP |
| 4 DIST/ETE | LEG DIST | GROUND SPEED | ENTRY | START→DISP | INOP | BACK |
|  | DIST REM | EST TIME ENR | DISPLAY | STOP→ENTRY | INOP | INOP |

TABLE 2
FREQ ENTRY WITH CORRECTION USING BACK KEY:

| KEY PRESS | SECOND FUNCTION BACK/ENTER |  |
|---|---|---|
|  | 119.00 | 119.50 |
| [1] | 119.00 | 100.00 |
| [2] | 119.00 | 120.00 |
| [3] | 119.00 | 123.00 |
| [BACK] | 119.00 | 120.00 |
| [1] | 119.00 | 121.00 |
| [STO] | 119.00 | 121.00 |

TABLE 3
FREQ ENTRY WITH TRANSFER TO ACTIVE WINDOW

| KEY PRESS | SECOND FUNCTION BACK/ENTER |  |
|---|---|---|
|  | 119.00 | 119.50 |
| [1] | 119.00 | 100.00 |
| [2] | 119.00 | 120.00 |
| [1] | 119.00 | 121.00 |
| [⟷] | 121.00 | 119.00 |

TABLE 4a
STORE STANDBY FREQ IN SPECIFIED MEMORY:

| KEY PRESS | SECOND FUNCTION BACK/ENTER |  |
|---|---|---|
|  | 119.00 | 121.00 |
| [STO] | 119.00 | X* |
| [5] | 119.00 | 5 |
|  | 119.00 | 121.00 |
|  | (after .5 sec) |  |

*PRECEEDING CHANNEL.

TABLE 4b
ENTER STANDBY FREQ & STORE IN SPECIFIED MEMORY:

| KEY PRESS | SECOND FUNCTION BACK/ENTER |  |
|---|---|---|
|  | 119.00 | 119.50 |
| [1] | 119.00 | 100.00 |
| [2] | 119.00 | 120.00 |
| [1] | 119.00 | 121.00 |
| [STO] | 119.00 | 121.00 |
| [STO] | 119.00 | X* |
| [5] | 119.00 | 5 |
|  | 119.00 | 121.00 |
|  | (after .5 sec) |  |

PRECEEDING CHANNEL.

TABLE 5a
RECALL OF FREQ FROM MEMORY WITH TRANSFER TO ACTIVE WINDOW:

| KEY PRESS | SECOND FUNCTION BACK/ENTER |  |
|---|---|---|
|  | 119.00 | 119.50 |
| [RCL] | 119.00 | X* |
| [3] | 119.00 | 3 |
|  | 119.00 | 121.00 |
|  | (after .5 sec) |  |
| [⟷] | 121.00 | 119.00 |

*PRECEEDING CHANNEL.

TABLE 5b
RECALL OF FREQ FROM MEMORY WHILE IN FREQ ENTRY MODE:

| KEY PRESS | SECOND FUNCTION BACK/ENTER |  |
|---|---|---|
|  | 119.00 | 119.50 |
| [1] | 119.00 | 100.00 |
| [2] | 119.00 | 120.00 |
| [STO] | 119.00 | 120.00 |

TABLE 5b-continued

RECALL OF FREQ FROM MEMORY WHILE IN FREQ ENTRY MODE:

| KEY PRESS | SECOND | FUNCTION BACK/ENTER |
|---|---|---|
| [RCL] | 119.00 | X* |
| [3] | 119.00 | 3 |
|  | 119.00 | 121.00 |
|  | (after .5 sec) | |

*PRECEEDING CHANNEL.

TABLE 6a

TO/FROM POSITION (2 t/f); NAV ACTIVE POSITION (act); COM FREQ ENTRY:

| KEY PRESS | SECOND | FUNCTION BACK/ENTER |
|---|---|---|
|  | Freq. | Brg. |
|  | 117.50 to | 359 |
| [1] | 100.00 | |
| [1] | 110.00 | |
| [4] | 114.00 | |
| [3] | 114.30 | |
| [STO] | 114.30 to | 020 |

TABLE 6b

TO/FROM TOGGLE (NAV ONLY)

| KEY PRESS | SECOND FUNCTION | BACK/ENTER |
|---|---|---|
|  | 114.30 to | 020 |
| [⇄] | 114.30 fr | 200 |

TABLE 6c

TO/FROM POSITION (t/f); NAV ACTIVE POSITION (act); COM RECALL OF FREQ FROM MEMORY INTO ACTIVE WINDOW WITH ABORT

| KEY PRESS | SECOND FUNCTION | BACK/ENTER |
|---|---|---|
|  | 114.30 to | 020 |
| [RCL] | X** | |
| CYCLE MODE SW | 114.30 to | 020 |

**REVERTS TO PREVIOUS DISPLAY AFTER 5 Secs.

TABLE 7

CLOCK POSITION (ck); NAV ONLY CLOCK TIMER OPERATION

| KEY PRESS | SECOND FUNCTION | BACK/ENTER |
|---|---|---|
|  | 114.30 | 70:59 |

TABLE 7-continued

CLOCK POSITION (ck); NAV ONLY CLOCK TIMER OPERATION

| KEY PRESS | SECOND FUNCTION | BACK/ENTER |
|---|---|---|
| [⇄] | 114.30 | 0:00 |

NOTE:
1. CLOCK ALWAYS RUNNING; IS RESET BY [⇄] KEY.
2. CHANGING MODE SWITCH DOES NOT AFFECT TIMER.

TABLE 8a

DISTANCE/TIME POSITION (d); NAV ONLY INITIAL ENTRY:

| KEY PRESS | SECOND FUNCTION | BACK/ENTER |
|---|---|---|
|  | Naut/miles | KNOTS/hr. |
|  | 00 N/M | K/T 000 |
| [BACK] | 000 N/M | K/T 000 |
| [1] | 100 N/M | K/T 000 |
| [1] | 110 N/M | K/T 000 |
| [0] | 110 N/M | K/T 000 |
| [1] | 110 N/M | K/T 100 |
| [8] | 110 N/M | K/T 180 |
| [⇄] | 110 N/M | 0:37 |

TABLE 8b

TOGGLE TO CHECK SPEED

| KEY PRESS | SECOND FUNCTION | BACK/ENTER |
|---|---|---|
|  | 104 N/M | 0:35 |
| [⇄] | 104 N/M | K/T 180 |
| [⇄] | 103 N/M | 0:35 |

TABLE 9a

2ND PASS ENTRY DIST ONLY: DIST REM ABOVE 99:

| KEY PRESS | SECOND FUNCTION | BACK/ENTER |
|---|---|---|
|  | 104 N/M | 0:35 |
| [⇄] | 104 N/M | K/T 180 |
| [1] | 100 N/M | K/T 180 |
| [1] | 110 N/M | K/T 180 |

TABLE 9a-continued

2ND PASS ENTRY DIST ONLY: DIST REM ABOVE 99:

| KEY PRESS | SECOND FUNCTION | BACK/ENTER |
|---|---|---|
| 5 | 115 $\frac{N}{M}$ | $\frac{K}{T}$ 180 |
| ⟵ | 115 $\frac{N}{M}$ | 0:38 |

TABLE 9b

2ND PASS ENTRY DIST 69; DIST REM BELOW 99:

| KEY PRESS | SECOND FUNCTION | BACK/ENTER |
|---|---|---|
|  | 95 $\frac{N}{M}$ | 0:32 |
| ⟵ | 95 $\frac{N}{M}$ | $\frac{K}{T}$ 180 |
| 8 | 80 $\frac{N}{M}$ | $\frac{K}{T}$ 180 |
| 5 | 85 $\frac{N}{M}$ | $\frac{K}{T}$ 180 |
| 2 | 85 $\frac{N}{M}$ | $\frac{K}{T}$ 200 |
| 4 | 85 $\frac{N}{M}$ | $\frac{K}{T}$ 240 |
| ⟵ | 85 $\frac{N}{M}$ | 0:21 |

DESCRIPTION OF VOR/LOC UNIT

Figure 3A:
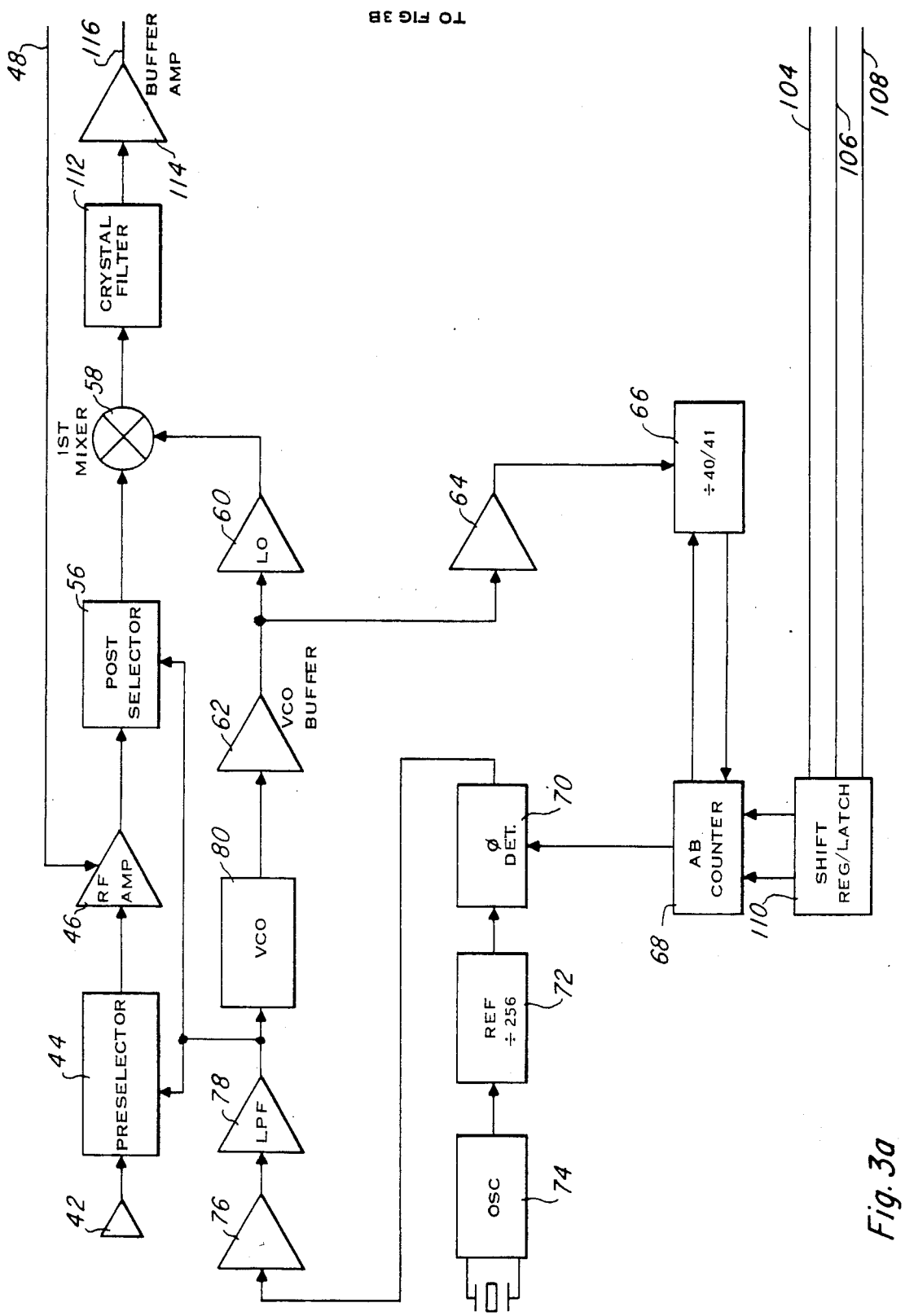
FIGS. 3a–3f constitute a block diagram of the VOR/LOC receiver of this invention.
Figure 3B:
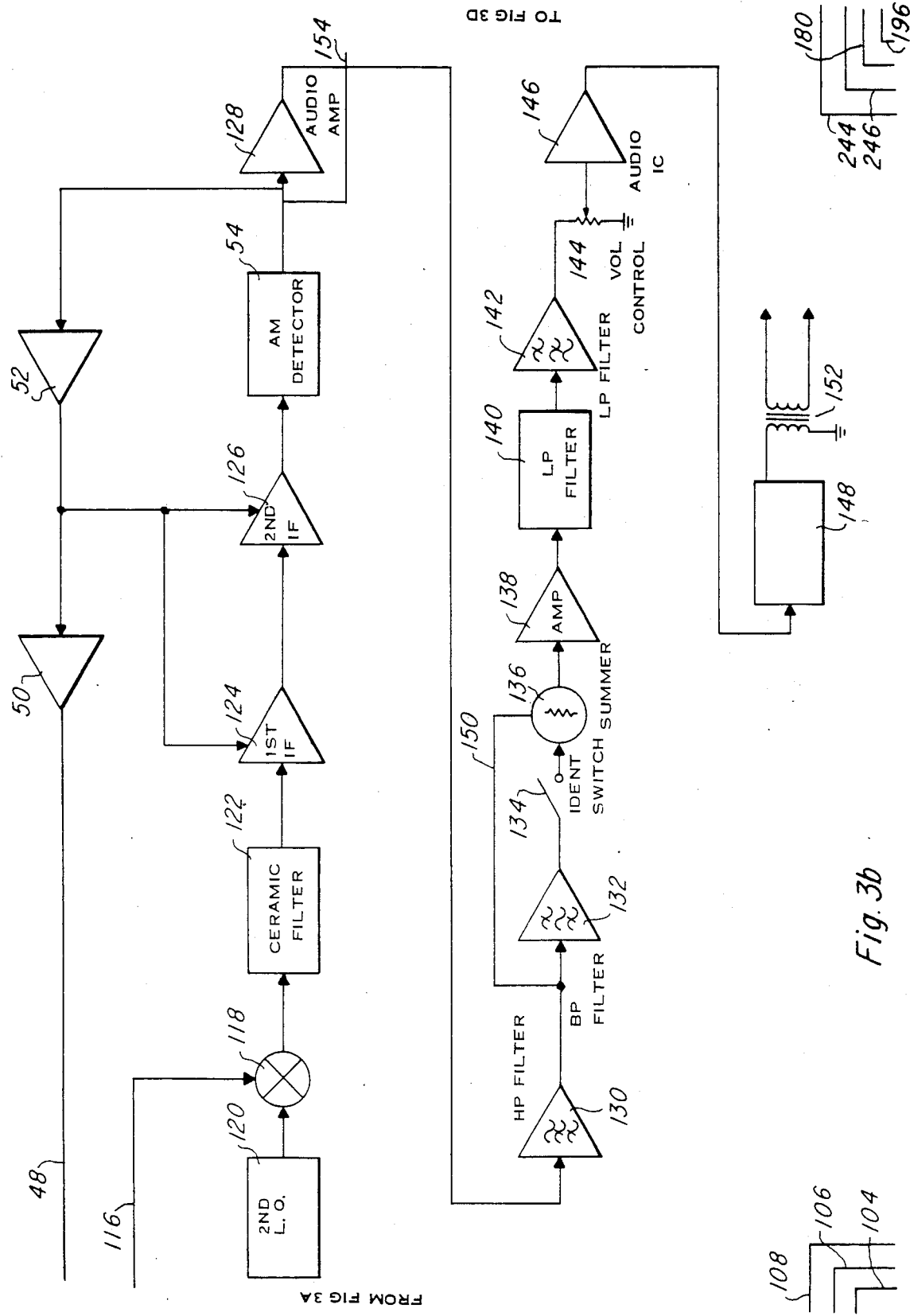
Figure 3C:
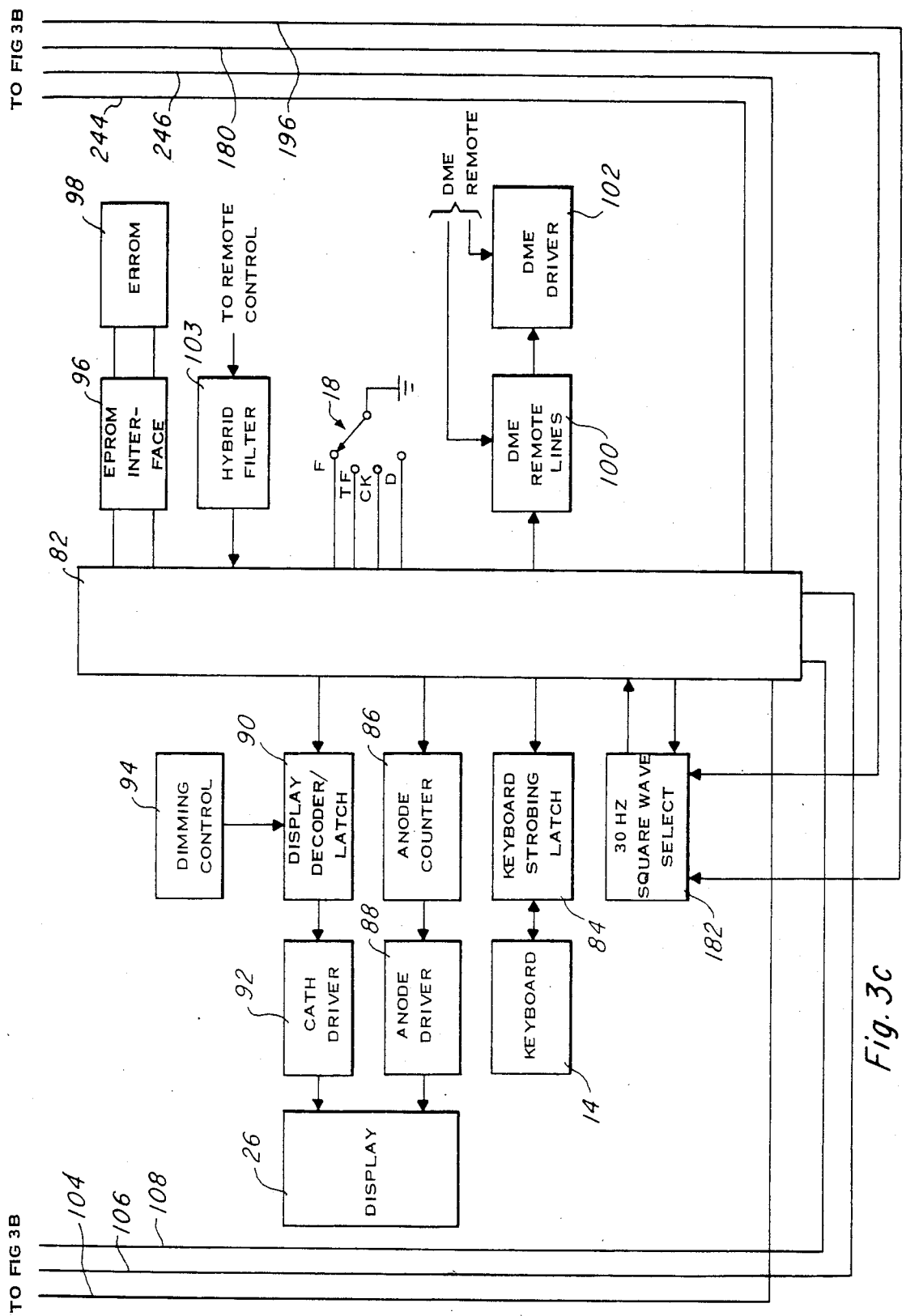
Figure 3D:
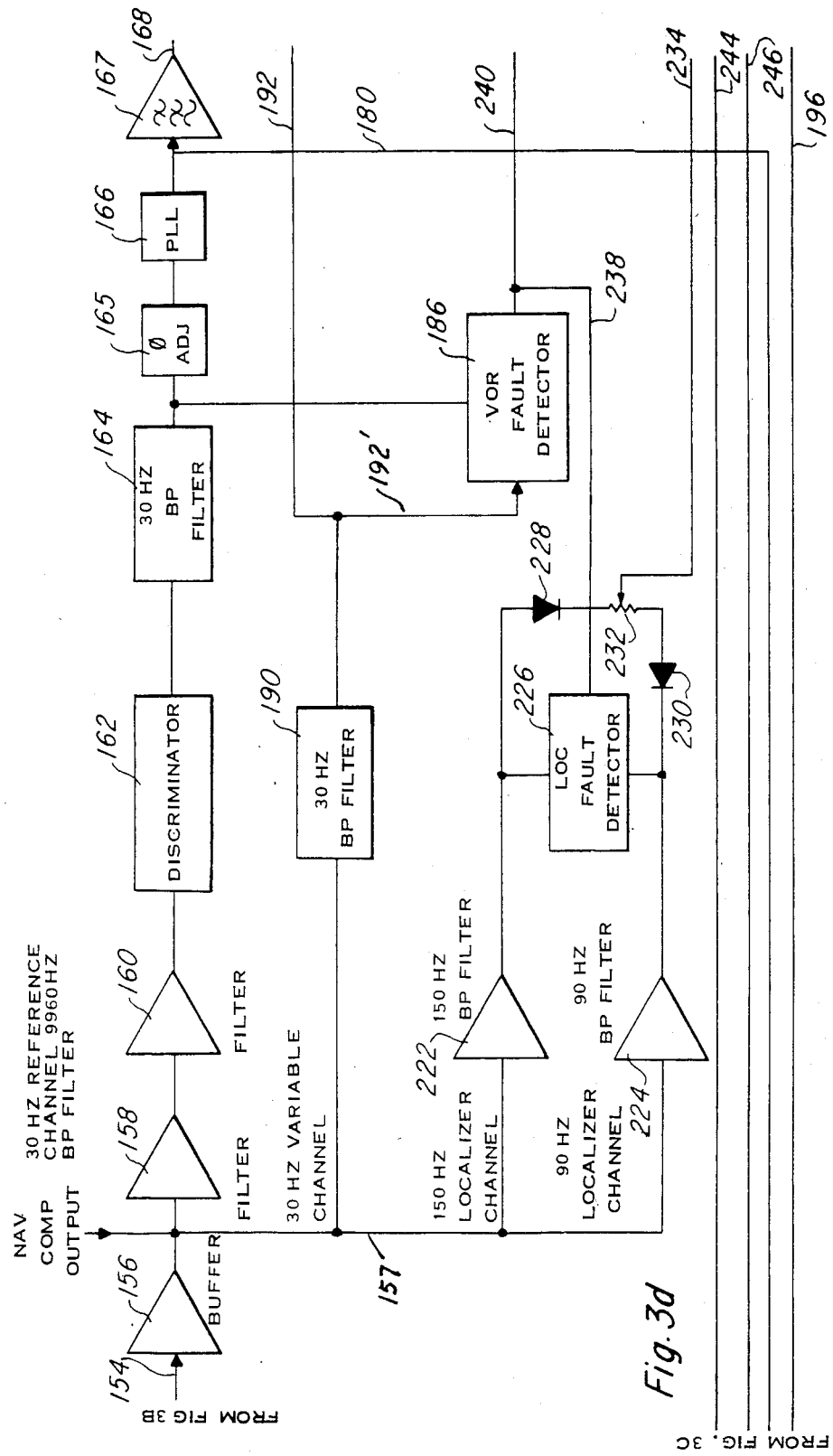
Figure 3E:
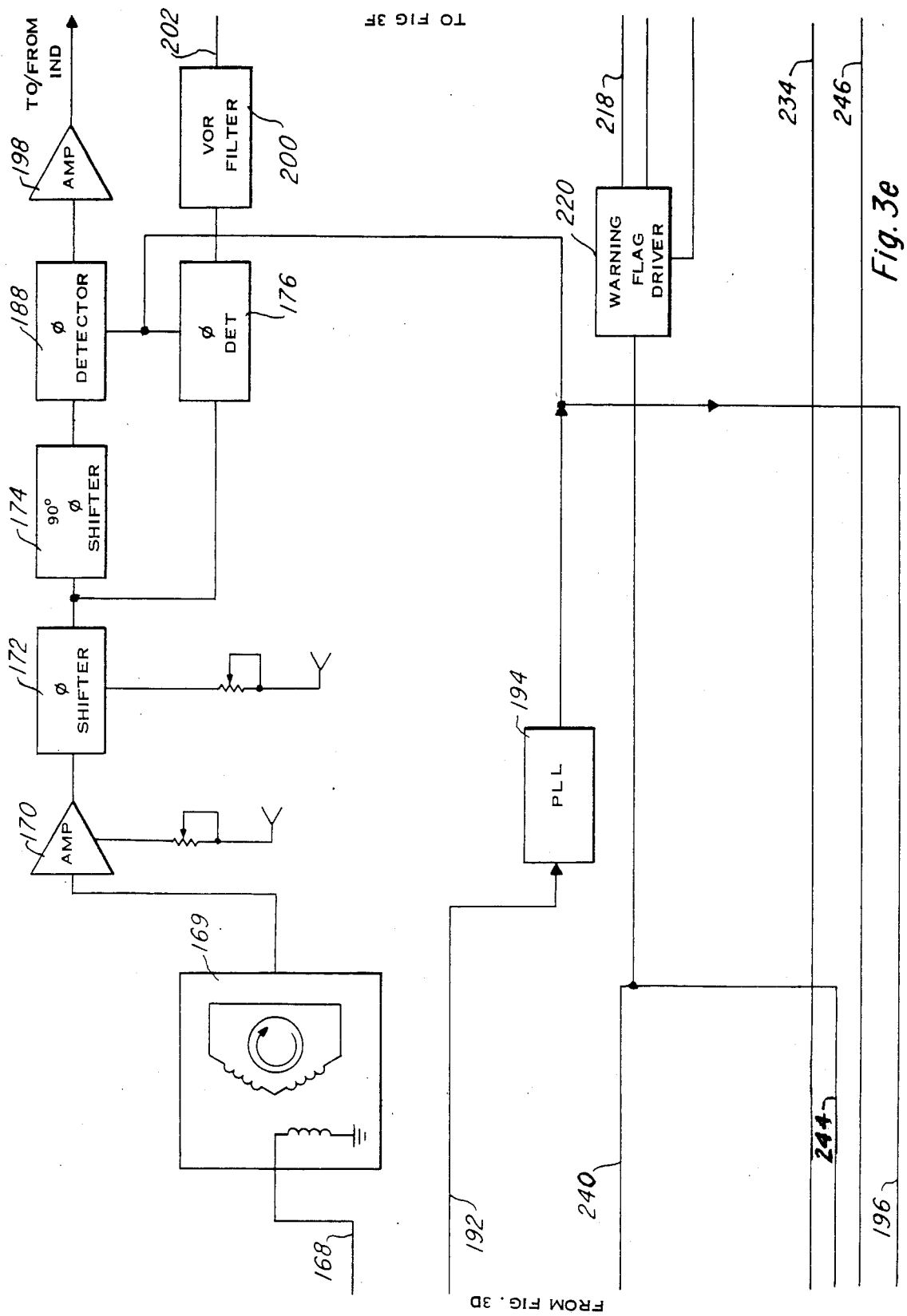
Figure 3F:
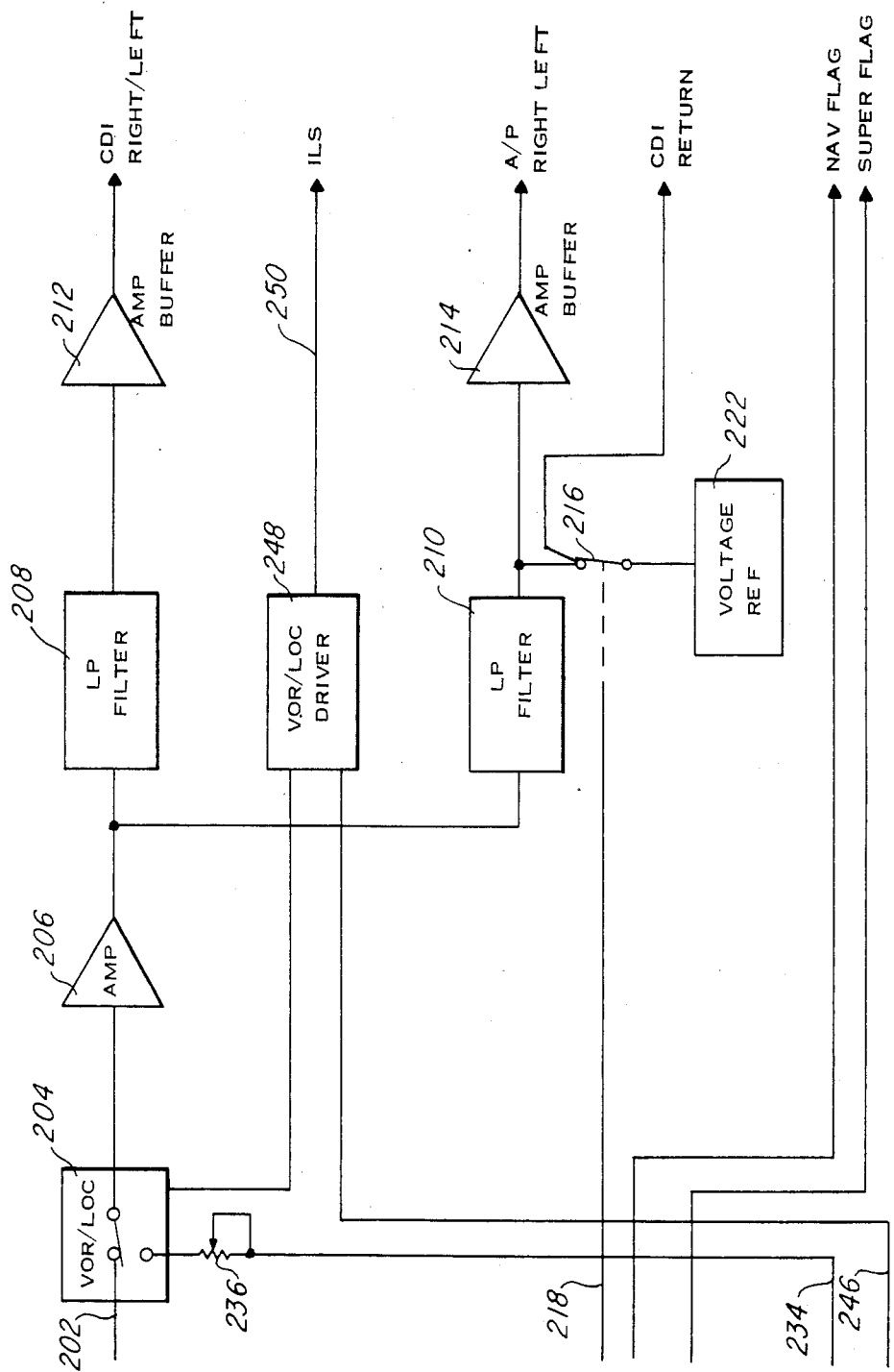

Referring now to FIGS. 3a-3f for a description of the VOR/LOC receiver unit, an antenna 42 (FIG. 3a) receives RF signals for the VOR/LOC receiver. The receiver amplifies and demodulates the RF carrier to provide audio to the voice circuits (also Morse Code signals) (FIGS. 3a and 3b) and navigational data to a VOR/LOC converter (FIGS. 3d-3f). Varactor tuning is used for the receiver RF circuits and the channel frequencies are determined and controlled by the data processor. (FIGS. 3a and 3c).

The preselector 44 (FIG. 3a) is continuously tuned by the LPE 78 to pass frequencies near a selected channel frequency between 108.000 to 117.950 MHz with 50 KHz spacing to the RF amplifier 46 which receives AGC from feedback lead 48. Lead 48 is connected to an RF/AGC amplifier 50 (FIG. 3b) which has its input connected to an IF/AGC amplifier 52. If AGC amplifier 52 is connected to the output of AM detector 54, the RF amplifier 46 (FIG. 3a) has its gain controlled by the RFAGC amplifier 50. The output of the RF amplifier 46 (FIG. 3a) is connected to a postselector 56 for further removing any signals other than those near the desired channel. The output of the postselector 56 is connected to a first mixer 58. The function of the first mixer 58 is to act as a first intermediate frequency converter. The first mixer 58 may be, for example, a dual gate MOS-FET.

The RF input to the mixer is beat with the signal from local oscillator amplifier's 60 output that is connected to the second input of the mixer. The input to the LO amplifier 60 is the voltage controlled oscillator output of a frequency synthesizer.

The frequency synthesizer is comprised of a VCO buffer 62 having its output connected to the LO amplifier 60 and a prescaler buffer 64 in the divide by N counter feedback path. Prescaler buffer 64 is connected to a divide by 40/41 prescaler 66 of the divide-by N counter which also includes an AB counter 68 and a programmable phase-locked loop IC. A loop phase detector 70 input is connected to the AB counter 68 and to a divide by 256 divider 72 for its reference frequency output. The divide by 256 divider 72 is connected to a crystal oscillator 74 and divides the output of the crystal oscillator 74 to provide a stable 25 KHz reference signal to the phase detector 70 for comparison with the divide by N counter frequency.

The phase detector 70 and LPF 78 produce an error voltage that is proportional to the phase difference between the reference and input frequency. The LPF 78 input is amplified in amplifier 76 and its output applied to a voltage controlled oscillator (VCO) 80 and the preselector 44 and postselector 56 for tuning. The applied voltage to the VCO 80 is polarized to bring the input frequency at the phase detector 70 in agreement with the reference frequency. The phase detector 70, LPF 78 and VCO 80 make up the forward path of the loop, while the divide by N counter (amplifier 64, divide by 40/41 prescaler 66, and AB counter 68) constitute the feedback path. A data processor 82 (FIG. 3c) provides the digital word for the selected frequency to the AB counter as follows.

The data processor (FIG. 3c) includes, for example, the microprocessor 82 which determines the necessary 19 bit code that programs the VOR/LOC frequency synthesizer. This code is for any of the local oscillator frequencies covering 40.20 to 100.15 MHz in 50 KHz intervals; these frequencies correspond to the NAV frequencies of 108.00 MHz to 117.95 MHz. The microprocessor 82 is connected to a keyboard strobing latch 84 which monitors the keyboard panel 14 (FIG. 1). The microprocessor 82 (FIG. 3c) is connected to an anode counter (digit select) 86. Anode counter 86 continuously counts eight digits in a preselected sequence, e.g. 1, 3, 5, 7, 2, 4, 6, 8. The anode counter is connected to an anode driver 88 which is connected to the anodes of eight segments of each of the eight digits of displays 28 and 30 of digital display 26 to supply a high anode voltage to the digits in sequence.

The microprocessor 82 is also connected to a display decoder/latch 90 for decoding binary to binary coded decimal (BCD) words for digit segment selection. The display decoder/latch 90 is connected to a cathode driver 92. Cathode driver 92 is connected to the segment cathodes of the display digits to sink the cathode current of the segments selected by the microprocessor 82 to be time coincident with a particular digit counted by the anode counter 86 to display the selected frequency numbers. All outputs consist of switchable and programmable current sinks which provide current to the cathodes. A segment line that is turned on will not sink any current unless there is an anode voltage. It will be recalled that the first digit is always a "1" in both the active and standby displays, thus the counters eight counts are for digits 2-5 of eacy display. A digit dimming control 94 is connected to the display decoder/latch 90 for controlling the brightness of the display 26.

In addition the microprocessor 82 is connected to a nonvolatile EAROM (electrically alterable read only memory) interface 96 which is connected to EAROM 98 and delays microprocessor 82 access to the nonvolatile EAROM 98 at turn ON until power up. This is essential to the proper location of information stored in the memory. The data representing selected active and standby channel frequencies are stored in EAROM 98.

Also the microprocessor 82 is connected to the function switch 18. The function controller 18 controls the operation mode of the microprocessor. To provide a remote DME, DME lines 100 are connected to a DME driver 102. Also the microprocessor 82 can be remotely controlled through a hybrid filter 103 connected to a remote control switch not shown.

The microprocessor 82 is connected by leads 104, 106, and 108, respectively, to the clock, data and strobe terminals of a shift register/latch 110 (FIG. 3a). The shift register latch 110 is connected to the AB counter 68 and controls the AB counter of the frequency synthesizer; control is in response to the selected channel frequency data word it receives at its data terminal through lead 106 from the microprocessor 82.

Returning now to the first mixer 58, the first mixer is connected to crystal filter 112. The output of the first mixer 58 of the first IF stage is filtered in crystal filter 112. Crystal filter 112 is connected to amplifier 114 to amplify the filtered signal to a working level. Amplifier 114 is connected by lead 116 to a second mixer 118 (FIG. 3b). Mixer 118 is also connected to a second local oscillator 120. The mixer 118 beats the frequency of the first IF stage with the frequency of the local oscillator 120 to provide the standard 455 KHz IF signal.

The mixer 118 is connected to a ceramic filter 122 to remove any unwanted signals. The ceramic filter 122 is connected to a first IF amplifier 124. The IF amplifier 124 is connected to a second IF amplifier 126. The first and second IF amplifiers are connected to the IF AGC amplifier 52. As AGC is applied the output is stabilized at a preset level as a positive going AGC voltage reduces the gain of the IF amplifiers.

AM detector's 54 input is connected to the amplifier 126 and the NAV receiver output is applied to the navigation system audio and VOR/LOC buffer circuits.

The audio circuit includes elements connected in series as follows: an audio amplifier 128, a high pass filter 130, an identification filter including a bandpass filter 132 and switch 134, a summer 136, an amplifier 138, a low pass filter (passive) 140, low pass filter 142 (active), volume control 144, audio amplifier 146 and current limiter 148. When the identification switch 134 is closed the bandpass filter 132 provides a 1020 Hz filtered signal to the summer and when open the audio signal from the HP filter 130 is applied through lead 150 to the summer 136 and the identification filter is bypassed. With the switch closed the 1020 Hz Morse Code identification is subtracted from the audio signal leaving only the voice information. The audio signal, amplified to a working level by amplifier 138, is filtered in the passive and active low pass filters 140 and 142 to eliminate undesired noise. The wiper arm of volume control 144 is connected to the audio amplifier 146. The audio amplifier 146 output is current limited in current limiter 148 and applied to an audio transformer 152 of the power stage which supplies the large current variations necessary to drive a headphone (not shown).

VOR/LOC CONVERTER CIRCUITS

The VOR/LOC converter circuits convert the navigation information obtained from the receiver detector into data suitable for display on the L-R (left/right) deviation meter and TO/FROM flag of the auxiliary display.

The AM detector 54 (FIG. 3b) is connected by lead 154 to a VOR/LOC signal buffer 156 (FIG. 3d) which amplifies the detector signal (hereinafter referred to as the VOR/LOC signal) to a working level. The VOR/LOC signal is applied to a NAV composite output 157, reference channel, a variable channel and a pair of localizer channels. The VOR signal includes a 9960 Hz carrier that is frequency modulated at a 30 Hz rate and amplitude modulated by a 30 Hz signal. The 9960 Hz FM signal is for the reference channel and the 30 Hz signal is for the variable signal. The localizer (LOC) signal consists of 150 Hz and 90 Hz signals.

In the reference channel the VOR signal is applied to a 9960 Hz bandpass filter 158 which strips the 30 Hz portion from the composite signal. A limiter 160 connected to the filter 158 and a phase locked loop used as a discriminator 162 connected to the limiter provides a 30 Hz demodulated signal. A 30 Hz bandpass filter 164 connected to the discriminator 162 strips any excess noise from the signal.

A phase adjuster 165 is connected to the junction of BP filter 164 and a VOR fault detector 186 by lead 192'. The phase adjuster 165 is for adjusting any imbalance in phase shift between the reference and variable channels. A phase locked loop 166 is connected to the phase adjuster 165 for converting the 30 Hz reference sine wave to a 30 Hz reference square wave. A filter 167 is connected to the junction of a phase locked loop 166 for converting the 30 Hz square wave output to a 30 Hz sine wave output for a resolver 169 and lead 180 to a 30 Hz square wave selector 182 (FIG. 3c). Filter 167 (FIG. 3d) is connected by lead 168 to the rotor of a resolver 169 (FIG. 3e). The resolver 169 shifts the phase, as measured from the rotor signal, from 0 degrees to 360 degrees. The exact phase shift is set as the course knob is rotated to set the course. An amplifier 170 with gain adjust is connected to the resolver 169 and a variable phase shifter 172 with phase adjust is connected to the amplifier 170 to correct the gain and the phase for the fixed phase offsets inherent in the system. The phase shifter 172 is connected to a 90 degree phase shifter 174 and a phase detector 176.

The 90 degree phase shifter 174 (FIG. 3e) is connected to phase detector 188 (FIG. 3e). Phase detector 188 and phase detector 176 receive as inputs a 30 Hz signal from the 30 Hz variable channel as follows.

The 30 Hz variable channel includes a 30 Hz bandpass filter 190 (FIG. 3d) connected to the VOR/LOC buffer 156. The filter 190 is connected to the junction of fault detector 186 and lead 192. Lead 192 connects the filter 190 to a phase locked loop 194 (FIG. 3e). Phase locked loop 194 converts the 30 Hz variable signal from a sine wave into a 30 Hz square wave. The phased locked loop 194 is connected by lead 196 to the 30 Hz square wave select circuit 182 (FIG. 3c) and to the phase detectors 188 and 176 (FIG. 3e) to provide the squared 30 Hz variable signal as previously mentioned.

In phase detector 188, the 30 Hz reference phase signal is summed with the 30 Hz variable phase and compared to a reference voltage. The difference signal is amplified in amplifier 198 to provide a TO/FROM indicating signal—a negative voltage indicates a TO bearing and a positive voltage a FROM (radial) bearing. Phase detector 176 is connected as a switching integrator amplifier and produces from the 30 Hz reference frequency and 30 Hz variable frequency an error voltage when the signals differ in phase. When in phase no error signal is produced and a reference voltage is produced; a negative change indicates the aircraft is to the left of the course and a positive change indicates the aircraft is to the right of the course. The phase detector 176 is connected to a VOR filter 200 for removing any AC signals. The VOR filter 200 is connected by lead 202 to a VOR/LOC channel select switch 204 (FIG. 3f).

The VOR/LOC channel select switch 204 is connected to an amplifier 206 to restore the L/R signal to a working level. Amplifier 206 is connected to low pass filters 208 and 210. Low pass filter 208 is connected to buffer 212 to provide a working level Right/Left course deviation indicating signal for an aircraft CDI instrument. While low pass filter 210 is connected to a buffer 214 and switch 216. Buffer 214 provides a working level RIGHT/LEFT course deviation indicating signal for an auto-pilot. While switch 216 has its pole controlled by lead 218 to a warning flag driver 220 (FIG. 3e). One pole of switch 216 is connected to a reference voltage 222 and the other pole to a course deviation indicator return to apply the reference voltage to the CDI return line and autopilot when the switch 216 is closed.

LOCALIZER CIRCUITS

The localizer circuits include a 150 Hz channel and a 90 Hz channel (FIG. 3d). The 150 Hz channel and 90 Hz channel include, respectively, a 150 Hz bandpass filter 222 and a 90 Hz bandpass filter 224 connected to the VOR/LOC buffer 156 for filtering the LOC signal. The filters (222 and 224) 150 Hz and 90 Hz outputs are biased to a reference voltage ($+4\frac{1}{2}$ V) applied to their non-inverting (+) inputs. The filters 222 and 224 are connected to a LOC fault detector 226, and respectively, to rectifying diodes 228 and 230. Diode 228 is connected to one end of a LOC ZERO potentiometer 232 to provide a positive half wave rectified signal and diode 230 is connected to the other end of potentiometer 232 to provide a negative half wave output. The wiper arm picks the average of the two signals from the potentiometer. The arm is connected by lead 234 to a LOC course width adjust potentiometer 236 (FIG. 3f). The course width adjust potentiometer 236 is connected to the VOR/LOC channel switch 204 for processing through the RIGHT/LEFT course deviation indicating signal circuitry previously described for the VOR RIGHT/LEFT course deviation indicating signals.

VOR/LOC FAULT DETECTION

The LOC fault detector 226 (FIG. 3d) and the VOR fault detector 186 amplifier outputs are connected, respectively, by leads 238 and 240 to a wired OR gate (FIG. 3d). The OR output is connected to the warning flag driver 220 and to lead 244. Lead 244 is connected to the NAV fault terminal of microprocessor 82 (FIG. 3c).

Finally, the microprocessor 82 (FIG. 3c) has a VOR/LOC indicating terminal connected to lead 246 to a VOR/LOC driver 248 (FIG. 3f). The VOR/LOC driver 248 is also connected to the VOR/LOC switch 204 and to lead 250 to provide VOR/LOC channel selection signals, respectively, to the VOR/LOC switch 204 and to an external output for VOR/LOC channel selection by the navigator.

COMMUNICATION TRANSCEIVER

Figure 4A:
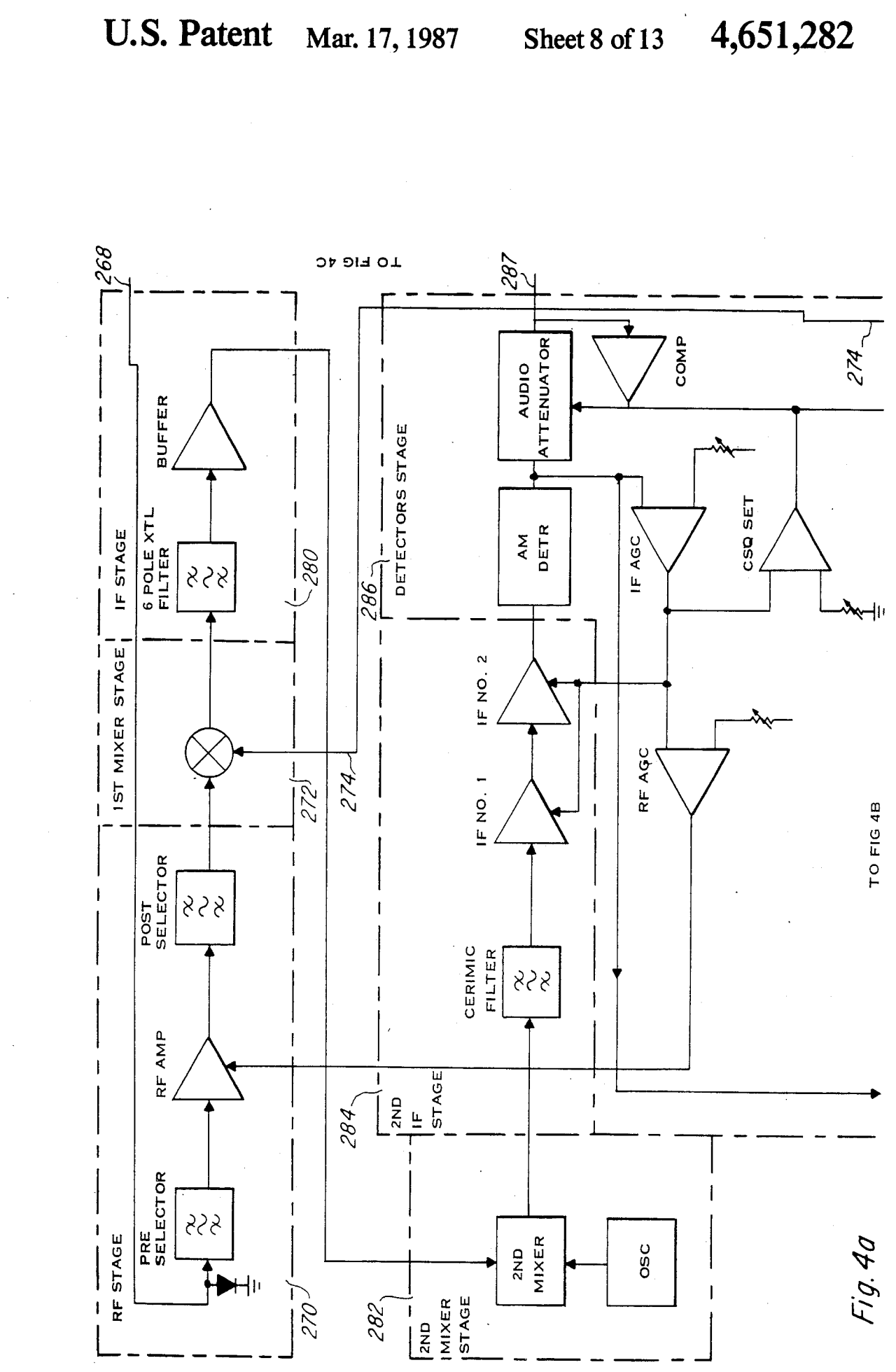
Figure 4B:
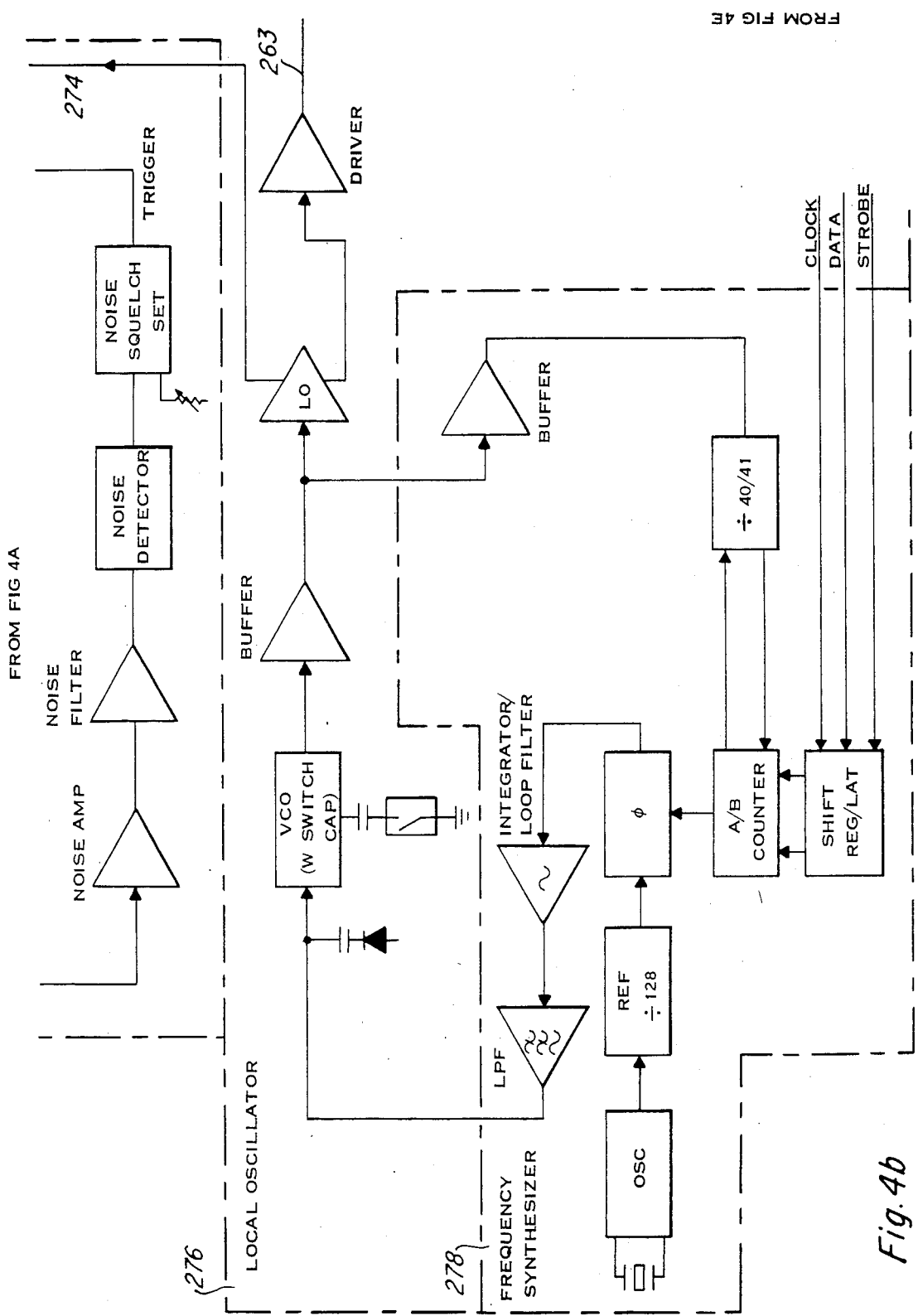
Figure 4C:
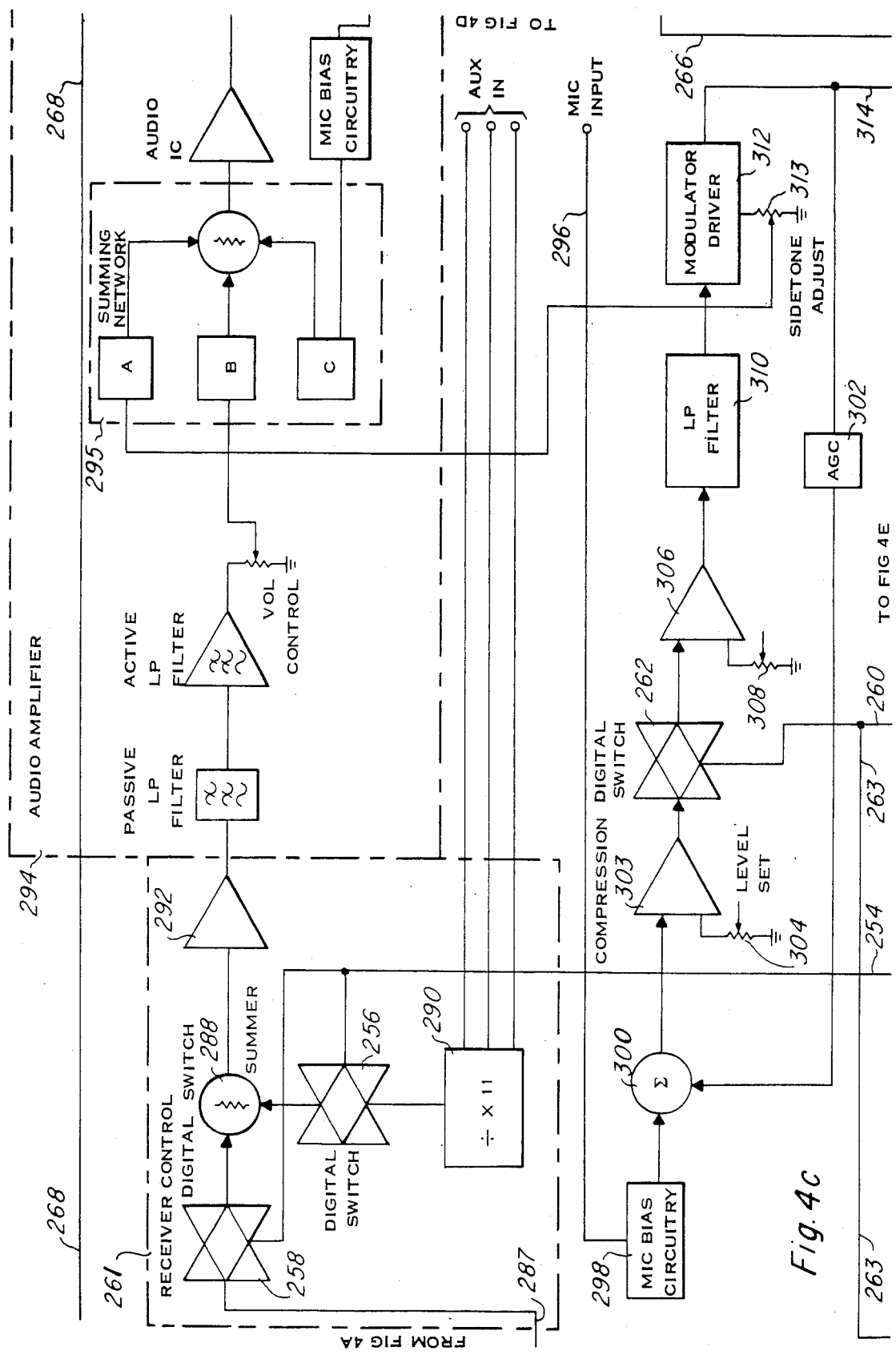
Figure 4D:
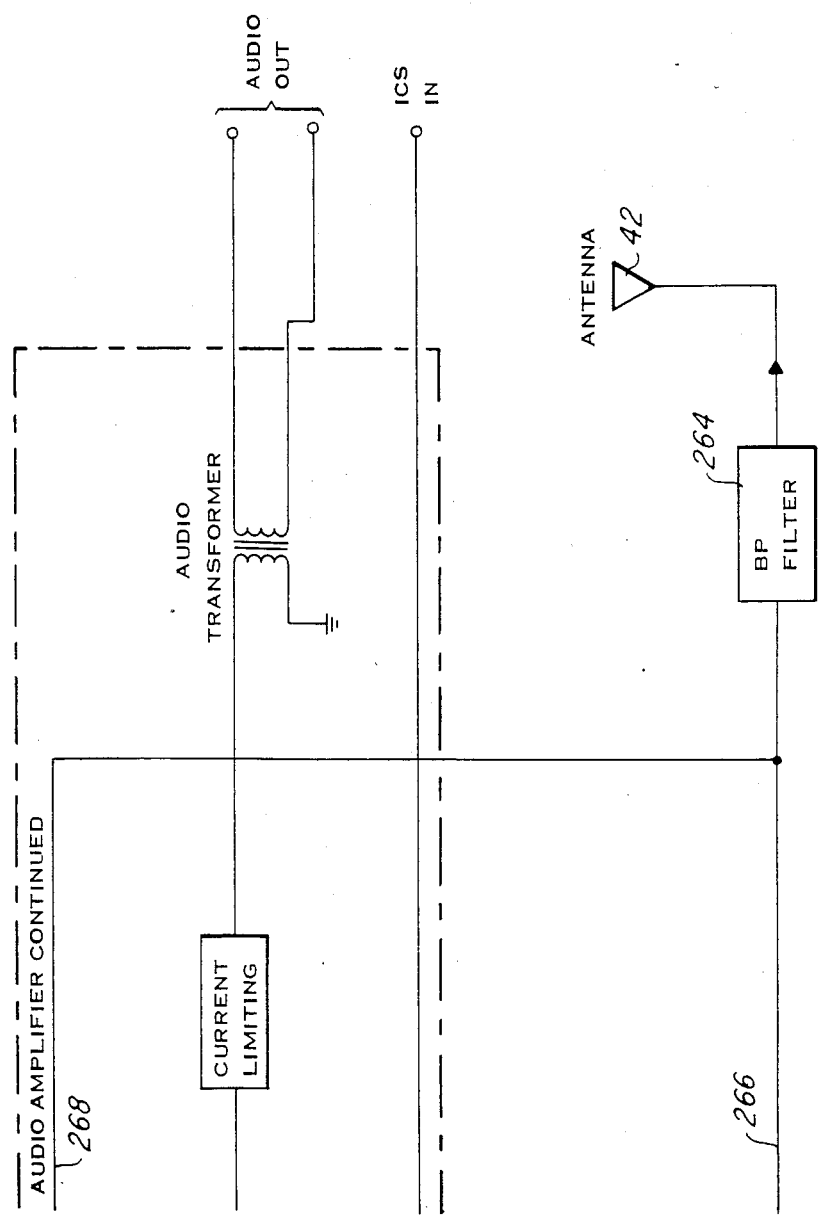
Figure 4E:
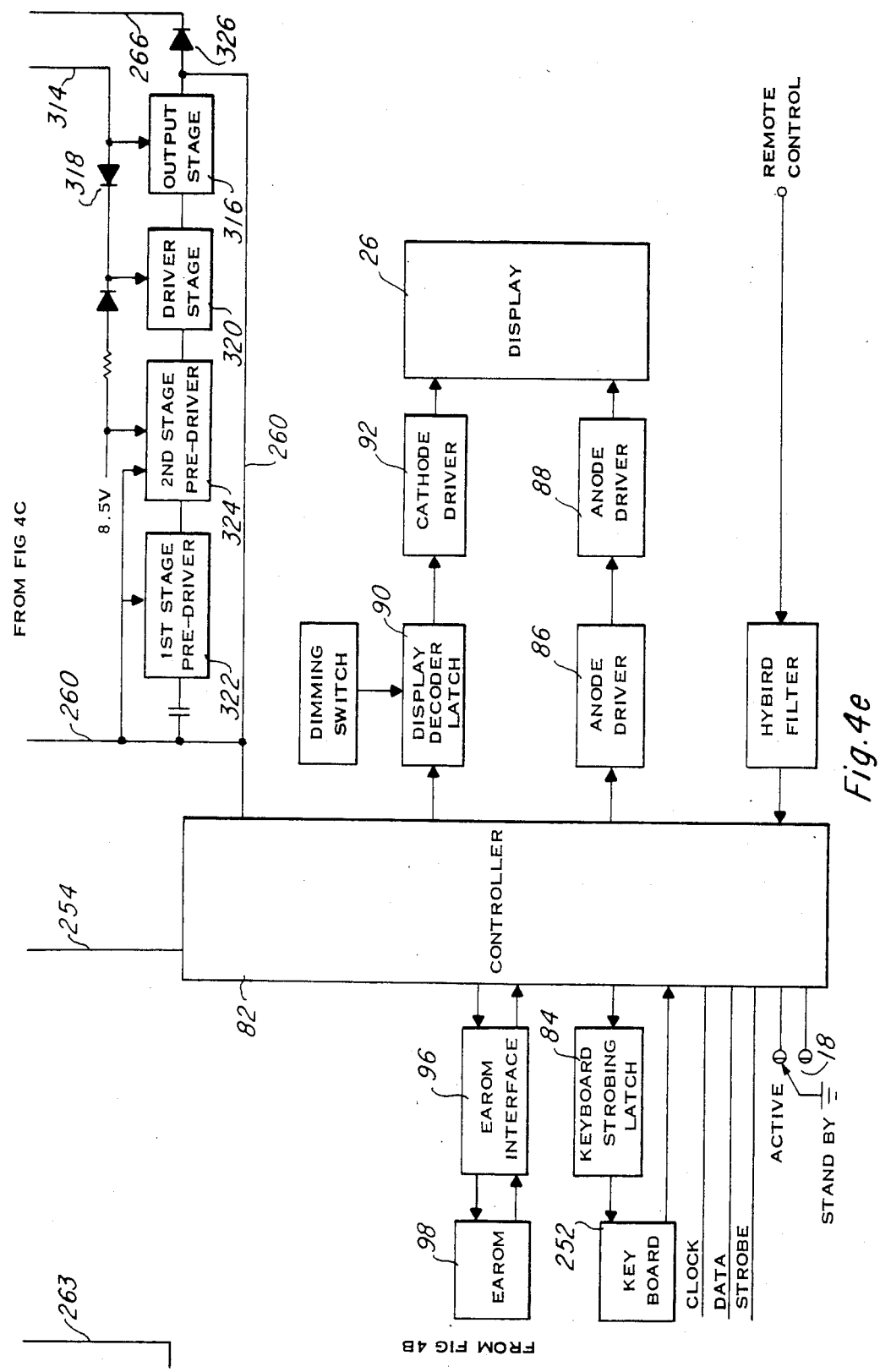

Referring now to FIGS. 4a-4e for a description of the communication transceiver, the front panel press keys 16, 20, 22, and 24 (FIG. 2) comprise the keyboard 252 (FIG. 4e). The keyboard 252 is connected to the keyboard strobing latch 84 which continuously monitors the keyboard keys for entries for the controller (microprocessor 82). Both the active and standby channel frequencies and reference numbers are stored by the controller 82 through the interface 96 into the nonvolatile EAROM 98. The function controller 18 sets the controller to the active or standby mode of operation.

The controller 82 has a receive and a transmit terminal. The receive terminal is connected by lead 254 to digital switches 256 and 258 in a receiver control section 261; while, the transmit terminal is connected by lead 260 to a digital switch 262 located in the transmitter circuit.

RECEIVER CIRCUIT

Insofar as the receiver elements of the communication transceiver are identical to those of the VOR receiver previously described, they will be grouped into subsystems shown in dashed lines on the drawing. The antenna 42 (FIG. 4d) is connected to a bandpass filter 264 for removing any unwanted frequencies (frequencies outside the bandpass) from the received or transmitted signals. The bandpass filter 264 is connected by leads 266 and 268, respectively, to the output of the transmitter circuit (FIG. 4e) and input of the receiver circuit (FIG. 4a).

The receiver circuit comprises an RF stage 270 connected to a first mixer stage 272. The RF amplifier amplifies the signals of the bandwidth filter to a working level and applies them to the first mixer stage. The first mixer stage is connected by lead 274 to a local oscillator 276 (FIG. 4b). The local oscillator is tuned by a controller controlled programmable frequency synthesizer 278 to put out a signal at a frequency that is above the RF frequency by a fixed difference for every channel at 25 Hz interval. The local oscillator output is mixed with the RF carrier in the first mixer stage 272 (FIG. 2a). The fixed frequency difference is the first IF output of the first mixer.

A first IF amplifier stage 280 is connected to a first mixer stage for amplifying the first IF output of the first mixer. A second mixer stage 282 is connected to the first IF stage amplifier output to reduce the IF frequency to the second IF of 455 KHz. A second IF stage 284 is connected to the second mixer stage for amplifying the second IF output of the second mixer stage.

A detector stage 286 (FIGS. 4a and 4b) is connected to the second IF stage for separating the audio from the RF component. The receiver control 261 (FIG. 4c) has its digital switch 258 connected by lead 287 to the audio output of the detector stage 286. Digital switch 258 has its output connected to a summer 288 where the audio is summed with any auxillary input such as, for example, a second receiver, applied through attenuate-by-11 attenuator 290 and digital switch 256. An amplifier 292 is connected to the summer 288 to restore the summer's output to a working level. An audio amplifier stage 294 (FIGS. 4c and 4d) is connected to the amplifier 292 of the receiver control 261 for providing audio signals to a speaker. The audio amplifier 294 includes a summing network 295 (FIG. 4c) of adders A, B, and C for producing a constant output voltage from the adders A, B, and C for, respectively, a headset transmitter hearing circuit, the receiver circuit, and the microphone bias circuit.

TRANSMITTER CIRCUIT

Referring to FIG. 4c, lead 296 connects a push-to-talk microphone (not shown) to a microphone bias circuit 298. A summer 300 is connected to the bias circuit and to an AGC circuit 302. An amplifier 303 is connected to the summer 300 and to a compression level set circuit 304. The amplifier 303 is connected to the circuit control digital switch 262. Switch 262 is also connected by lead 263 to the local oscillator 276 (FIG. 4b) for receiving the carrier frequency of the selected transmitter channel for modulation with the audio frequency output of amplifier 303. An amplifier 306 is connected to the digital switch 262 and to an RF power level set circuit 308. A low pass filter 310 is attached to the amplifier 306 to filter the RF carrier modulated signal. A modulator driver 312 is connected to filter 310 and a sidetone adjust potentiometer 314 whose arm is connected to the audio amplifier for adjusting the volume of the transmission being monitored through the receiver headset.

The modulator driver 312 is connected by lead 314 to the AGC circuit 302 for feedback to summer 300, output stage 316 (FIG. 4e) and diode 318. Diode 318 is connected to a driver stage 320. The driver stage 320 is connected to predriver stages which include a first stage predriver 322 connected to the controller's transmit terminal and a second stage predriver 324 connected to the first stage predriver stage 322 and a reference voltage. The second predriver stage 324 is connected to the driver stage 320. The output stage 316 is connected to lead 260 to the controller's transmit control terminal, to a diode 326 for cutting off the output stage 316 to the antenna during receive and by lead 266 to the bandpass filter 264 for transmission of the modulated signal by antenna 42.

NAV/COMM FUNCTION FLOW CHART

Figure 5:
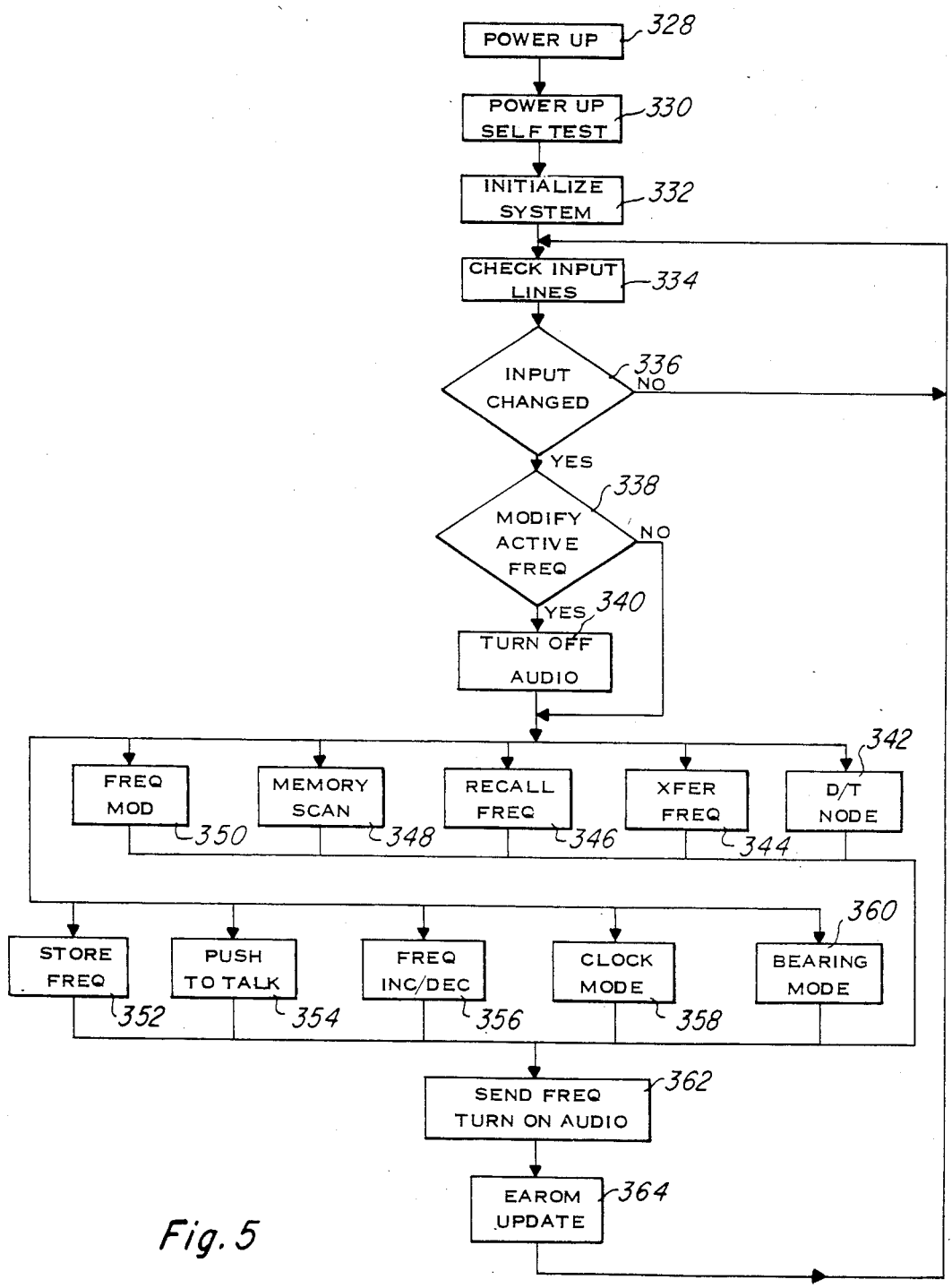
FIG. 5 is a flow diagram of the VHF communication/navigation systems.

Referring now to FIG. 5, when the VOR/LOC navigation receiver and communication transceiver are turned on the systems are powered up 328 and a power up self-test 330 performed. The system is then initialized 332. After initialization, the computer checks the input lines 334 including those from the keyboard strobing latch and makes a decision 336 whether any change has been made. If no, the input lines are continuously checked for change (334.336); if yes, a decision 338 is made whether an active frequency is to be modified. If yes, the audio is turned off 340. If no, the turn off frequency instruction is by-passed and the following inputs monitored for instructions as follows: function switch distance/time (D/T) mode 342 (D switch 18), transfer frequency 344 from standby to active and vice versa (⟵⟶ key 24), recall frequency 346 (key RCL 22), memory scan 348 ("0" key 16), standby frequency modification 350 ("1" key 16), store frequency 352 ("STO" key 20), push-to-talk 354 (microphone), frequency increase/decrease 356 (remote control), clock mode 358 (function switch 18 CK position) and bearing mode 360 (T/F switch 18). After frequency selection or change a key check, an instruction 362 to send frequency and turn on audio is issued which is followed by an instruction 364 to update the EAROM.

Although a preferred embodiment of the present invention has been described in detail, it is to be understood that various changes and substitutions and alterations can be made therein without departing from the scope of the invention as defined by the appended claims.

What is claimed is:

1. An airborne avionic system comprising:
   (a) a controller means for controlling the operation of the airborne avionic system;
   (b) a front panel means including a multiple display means operatively connected to the controller means for displaying selectable function information including an active function information display and a standby function information display, a multiple function mode selection switch operatively connected to the controller means for selecting the mode of operation of the airborne system, a plurality of press-key type keys operatively connected to the controller means for inputting function information including the active function information and the standby function information to the controller means, and a plurality of function control keys operatively connected to the controller means for selecting the function information to be displayed by the display means and for selecting the function information to be entered into the controller means; and
   (c) a receiver means operatively connected to the controller means for receiving function information including selected channel frequency tuning information.

2. The airborne avionic system according to claim 1 wherein the controller means comprises:
   a key strobing means connected to the front panel means for strobing the plurality of press-key type keys; the controller means includes; a microprocessor operatively connected to the key strobing means for receiving the entered function information, a non-volatile storage means operatively connected to the microprocessor for storing a plurality of preselected channel frequencies in locations addressable by the plurality of press-key type keys whereby preselected channel frequencies to be encountered during a flight may be entered prior to take-off and thereafter changeable to meet in flight originating requirements for communication and navigation.

3. The airborne avionic system according to claim 1 wherein the airborne avionic system includes a communication system and the multiple function mode selection switch includes active channel and standby channel switches for selectively inputting, respectively, active channel frequency information and standby channel frequency information into the controller means for the communication system.

4. The airborne avionic system according to claim 1 wherein the the airborne avionic system includes a multiple function navigation system and the plurality of function control keys include switches for selectively inputting, respectively in the receiver means, frequency, bearing to and radial, clock, and distance and estimated time en route instructions to the controller means.

5. The airborne avionic system according to claim 3 wherein the communication system includes a communication transceiver and the plurality of function control keys include switches for selectively inputting, respectively, frequency for the communication transceiver.

6. The airborne avionic system according to claim 1 wherein the multiple displays means comprise two, five digit displays having decimal point indicators between selected digits and flight data annunciators and transmit annunciators.

7. The airborne avionic system according to claim 1 wherein the plurality of press-key type keys operatively connected to the controller means for entering and recalling preselected functional information pertinent to the operation of an airborne carrier including preselected channel frequencies comprise ten keys numbered "0" through "9" operative in connection with selected positions of the multiple function mode selection switch and a first function control key for selectively entering and storing in the controller means channel frequencies for a plurality of selected channel frequencies.

8. The airborne avionic system according to claim 7 further including a second function control key in operative association with the first function control key to selectively back up frequency entry for correction and to recall a preselected channel frequency stored in the controller means.

9. The airborne avionic system according to claim 1 wherein the multiple function mode select switch has a plurality of function positions/modes including, respectively, frequency, to/from, clock, and distance/estimated time en route positions and a third function control key operative in association with the function switch positions, respectively, for selecting the digital display for swapping the display of an active and a standby channel frequency, for displaying bearing-/radial "TO" or "FROM" station (TO/FROM) information, for resetting the clock for route leg and landing approach timing, and for selectively entering the leg distance and ground speed and for displaying the leg distance remaining and estimated time en route remaining or leg distance remaining and ground speed.

10. The airborne avionic system according to claim 1 wherein the receiver means further includes a transmitter means operatively connected to the receiver means for forming a transceiver, means for selecting the transmitter means for transmission and means connecting the transmission means to the receiver for monitoring the transmission.

11. The airborne avionic system according to claim 1 wherein the receiver means comprises: VOR circuits including a 30 Hz reference circuit, a 30 Hz variable circuit and a phase detector means to provide VOR circuits TO/FROM signals and, LOC circuits including a 150 Hz circuit, a 90 Hz circuit, and a LOC zero means for producing, selectively, Right/Left of course signals and on course signals, and a VOR/LOC switch means operatively connected to the VOR/LOC circuits for, selectively, outputting the TO/FROM signals and the RIGHT/LEFT of course signals and on course signals.

12. The airborne avionic system according to claim 11 wherein the VOR/LOC circuits further include station fault detector circuits.

13. The airborne avionic system according to claim 9 wherein the controller means includes a data processor for storing in memory ground speed information and distance remaining and continuously computing a leg distance remaining and estimated time en route remaining for selectively displaying the leg distance remaining and time en route remaining, and leg distance remaining and ground speed.

14. The airborne avionic system according to claim 9 wherein the controller means includes a data processor having a timer clock for displaying elapsed time.

15. The airborne avionic system according to claim 1 wherein the multiple function mode selection switch comprises a push/pull switch for selectively enabling and disabling the station identification information.

16. The airborne avionic system according to claim 3 wherein the communication system includes an audio squelch circuitry and the multiple function mode selection switch comprises a push/pull switch for selectively enabling and disabling the audio squelch circuitry in the communication system.

* * * * *